(12) United States Patent
Simon

(10) Patent No.: US 6,400,194 B1
(45) Date of Patent: Jun. 4, 2002

(54) SYNCHRONOUS FEEDBACK DIGITAL CIRCUIT HAVING A MINIMIZED SWITCHING POWER LOSS

(75) Inventor: Sven Simon, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/642,332

(22) Filed: Aug. 21, 2000

(30) Foreign Application Priority Data

Aug. 20, 1999 (DE) ...................................... 299 14 622 U

(51) Int. Cl.⁷ .............................................. H03B 19/00
(52) U.S. Cl. ........................................ 327/141; 327/291
(58) Field of Search ................................ 327/141, 544, 327/291; 708/625, 627

(56) References Cited

U.S. PATENT DOCUMENTS 4,546,446 A * 10/1985 Machida ...................... 364/759

5,365,182 A * 11/1994 King

* cited by examiner

*Primary Examiner*—Dinh T. Le
(74) *Attorney, Agent, or Firm*—Laurence A. Greenberg; Werner H. Stemer; Gregory L. Mayback

(57) ABSTRACT

The novel synchronous feedback digital circuit has a minimized switching power loss. A data input receives an input data stream. A multiplicity of logic circuits and clocked registers are connected in a feedback loop between the data input and a data output. A clock generator generates an operating clock signal and a signal generating device generates phase-shifted clock signals for the clocked registers. The phase-shifted clock signals are phase shifted for the specific registers by $$\varphi_{N-i-1} = \frac{N - [i \bmod N] - 1}{N} \cdot T,$$

where T is an operating clock period of the operating clock signal, N is a factor, i is a number of registers between the register clocked by the phase-shifted clock signal and the data input of the digital circuit.

6 Claims, 3 Drawing Sheets

SYNCHRONOUS FEEDBACK DIGITAL CIRCUIT HAVING A MINIMIZED SWITCHING POWER LOSS

BACKGROUND OF THE INVENTION

Field of the Invention

The invention lies in the electronics field. More specifically, the invention relates to a synchronous feedback digital circuit having a minimized switching power loss.

Synchronous digital circuits are clocked circuits which have either a non-cyclic signal flow graph or a cyclic signal flow graph. In synchronous digital circuits, so called glitches, i.e. processes of switching back and forth when data streams are applied to data inputs, can occur when data streams are applied to data inputs of the digital synchronous circuit. The processes of switching back and forth occur until a stable state is reached at the output of the digital circuit.

In digital synchronous circuits which have a non-cyclic signal flow graph, one possibility for reducing the propagation of glitches on the signal paths within the digital circuit is so-called pipelining, i.e. the insertion of clocked registers or buffer stores into the signal paths. The clocked inserted registers act like barriers which block or prevent further propagation of glitches from one logic circuit within the digital circuit to the logic circuit connected downstream.

Propagation of the glitches within the digital circuit can also be achieved by the insertion of logic gates, for example of AND gates, into the non-cyclic signal flow chart.

In synchronous digital circuits having a cyclic signal flow graph, i.e. with feedback signal paths, the customary insertion of registers or buffer stores into the signal propagation path leads to corruption at the output of the digital circuit, i.e., with a constant data stream pattern at the input of the digital circuit, the data stream that is output at the output of the digital circuit is changed undesirably by the insertion of the registers.

The glitches or switching back and forth lead to charge reversal processes between logic circuits within the digital circuit, a switching power loss being produced. This increased switching power loss results in an increased current consumption of the digital circuit and in additional heating. Particularly when the digital circuit is fitted in mobile devices such as mobile telephones, the increased current consumption for the digital circuit can result in the accumulator discharging more rapidly. As a result of the additional heating of the digital circuit on account of the increased switching power loss which is caused by the glitches, additional cooling devices are necessary in densely packed, highly complex integrated circuits.

SUMMARY OF THE INVENTION

The object of the invention is to provide a synchronous feedback digital circuit which overcomes the above-noted deficiencies and disadvantages of the prior art devices and methods of this kind, and which has a minimized switching power loss.

With the above and other objects in view there is provided, in accordance with the invention, a synchronous feedback digital circuit with a minimized switching power loss, comprising:
  a data input for receiving an input data stream;
  a plurality of logic circuits connected to the data input;
  a plurality of clocked registers;
  a clock generator for generating an operating clock signal at an operating clock period;
  a signal generating device connected to the clock generator and to the clocked registers for generating phase-shifted clock signals for the clocked registers, the phase-shifted clock signals having a phase shift $\phi_i$ for a specific the register $$\varphi_{N-i-1} = \frac{N - [i \bmod N] - 1}{N} \cdot T$$

where T is an operating clock period of the operating clock signal, N is a factor, i is a number of registers between the register clocked by the phase-shifted clock signal and the data input of the digital circuit.

In accordance with an added feature of the invention, the registers are flip-flop circuits. Alternatively, the may be latch circuits.

In accordance with an additional feature of the invention, the signal generating device is a phase shift device comprised of a plurality of flip-flop circuits.

In accordance with a concomitant feature of the invention, the digital circuit is produced in CMOS technology.

Other features which are considered as characteristic for the invention are set forth in the appended claims.

Although the invention is illustrated and described herein as embodied in a synchronous feedback digital circuit having a minimized switching power loss, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
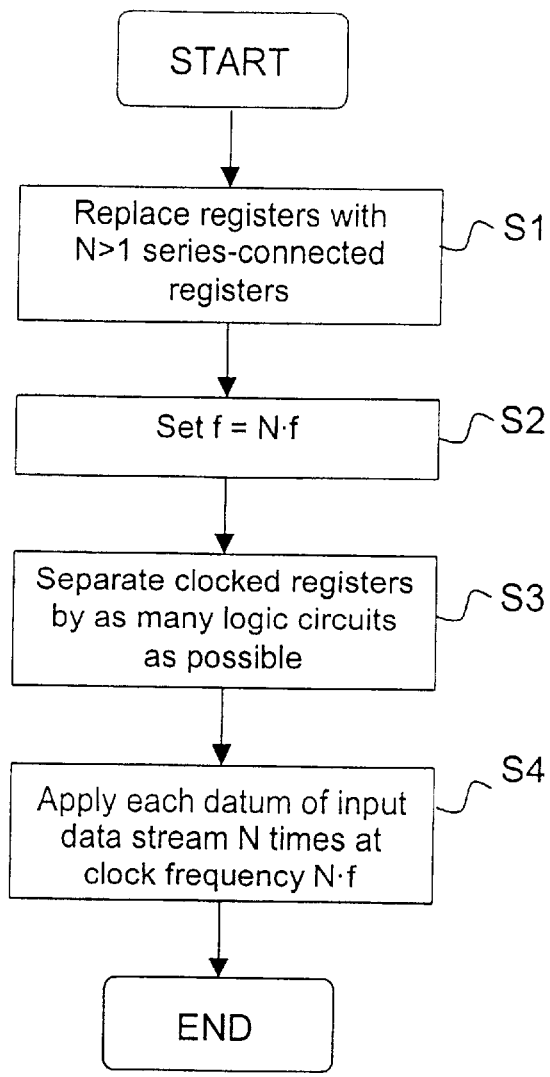
FIG. 1 is a flow diagram illustrating a method for designing the circuit according to the invention.

Referring now to the figures of the drawing in detail and first, particularly, to FIG. 1 thereof, there is seen a flow sequence diagram which elucidates the method for forming the circuit according to the invention. Proceeding from an already existing synchronous digital circuit having instances of feedback, the circuit is optimized by the targeted insertion of clocked registers in such a way that overall the digital circuit has a minimal switching power loss. It is ensured, at the same time that, with a constant data input stream at the input of the digital circuit, the data output stream of the digital circuit remains unchanged with the insertion of the registers.

The synchronous digital output circuit has at least one register which is clocked by a specific operating clock frequency f, and also a multiplicity of logic circuits for the data processing of the data streams present at the data inputs of the synchronous digital circuit. The operating clock signal with the operating clock frequency f is in this case generated by a clock generator. The logic circuits are circuits for implementing logic, such as logic gates or multipliers. The clocked registers are latch circuits or flip-flop circuits. The digital circuit can be constructed using any desired technology, in particular as a CMOS circuit.

In a first step S1 of the design method for designing the circuit according to the invention, the registers present in the original feedback synchronous digital circuit are each replaced by N series-connected registers, where N is an integer greater than 1. At each location within the feedback synchronous digital circuit where a clocked register or a clocked buffer store is present, N−1 clocked registers are additionally inserted into the data path line.

In a step S2, the operating clock frequency f is increased by the factor N to an increased clock frequency N·f.

The additional clocked registers produced in the course of the replacement step S1 are displaced or shifted to the outputs of the logic circuits connected downstream within the digital circuit in such a way that the clocked registers are connected so as to be separated from one another by as many logic circuits as possible.

Each datum of a data stream present at a data input of the digital circuit is applied N times to the data input and the clock frequency N·f is reduced by the factor to the original operating clock frequency f, so that the data of the data stream are applied at the operating clock frequency f. The clocked registers are thereby clocked by a phase-shifted clock signal whose phase shift depends on a number i of those registers which are located or connected between the respective register and a data input of the synchronous digital circuit.

After the configuration design illustrated in FIG. 1 has been carried out, the digital circuit derived from the original digital output circuit has a minimal switching power loss, whereas the throughput rate of the digital circuit is unchanged at the same time. The decrease in the power loss is effected by the additional inserted registers, which prevent the propagation of glitches in the data paths of the digital circuit. The original digital output circuit is transformed by the design method in such a way that the functionality of the digital circuit itself remains unchanged, i.e., with a constant data stream pattern at the data inputs of the digital circuit, the data stream that is output at the outputs of the digital circuit is the same in the case of the original digital output circuit and the digital circuit that has been transformed in accordance with the design method. The data throughput rate is also the same in the case of the original digital output circuit and the transformed digital circuit.

Figure 2:
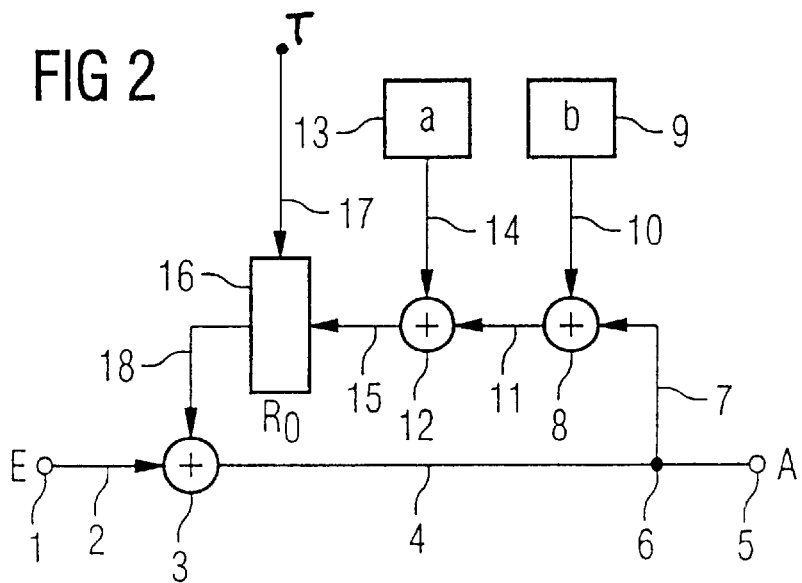
FIG. 2 is a schematic block diagram of a feedback synchronous digital circuit whose switching power loss is reduced by application of the novel method.

FIG. 2 shows an example of a feedback synchronous digital output circuit in which it is possible to apply the design method for reducing the switching power loss.

The digital circuit shown in FIG. 2 has a data input 1, which is connected to a summing element 3 via a line 2. The summing element 3 is connected to an output 5 of the digital circuit via a line 4. At a branch node 6, the output signal is passed to a further summing element or adder 8 via a feedback line 7. The summing element 8 adds the output signal present on the line 7 to a constant factor b, which can be stored in a storage device or memory 9. The storage device 9 is connected to the summing element 8 via a line 10. The summation signal formed at the summing element 8 is fed to a further adder 12 via a connecting line 11. The summing element 12 sums a further constant a, stored in a storage device or memory 13, and the signal present on the line 11. The summing element or the adder 12 is connected to the memory 13 via a line 14. The summation output signal of the summing element 12 is fed to a clocked register 16 via a line 15. The clocked register 16 is clocked via a clock line 17. The output signal of the register 16 passes via a line 18 to the subtracting element 3.

The feedback synchronous digital circuit shown in FIG. 2 constitutes merely one example of a simple digital circuit for elucidating the design method.

If a data stream is applied to the input 1 of the digital circuit, the digital circuit shown in FIG. 2 outputs an output data stream at the output 5. The output data stream A is produced as a function of the input data stream E in accordance with the table below, if the input data stream comprises for example an ascending constant sequence of data 0, 1, 2. The table furthermore indicates the value present at the output of the register 16.

TABLE 1

| i | E(i) | $R_0 = A(i-1) + a + b$ | $A(i) = E(i) + R_0(i)$ |
|---|------|------------------------|------------------------|
| 0 | 0    | 0                      | 0                      |
| 1 | 1    | a + b                  | 1 + a + b              |
| 2 | 2    | 1 + 2a + 2b            | 3 + 2a + 2b            |

Figure 3:
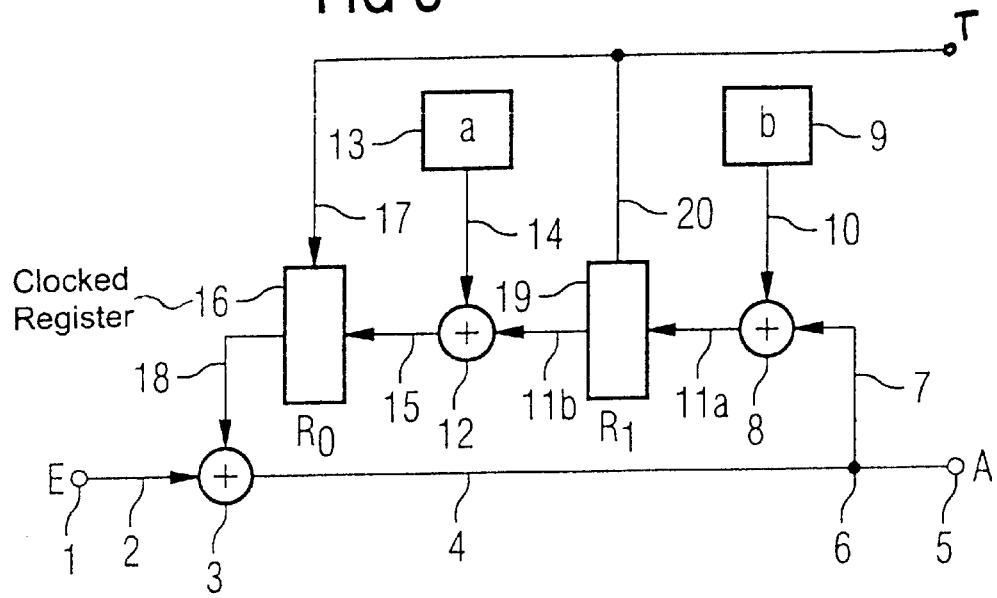
FIG. 3 is a schematic block diagram of the feedback synchronous digital circuit of FIG. 2 with an additionally inserted register for eliminating glitches, corruption of the data stream occurring at the output of the digital circuit.

In the synchronous digital circuit illustrated in FIG. 3, the glitches that are produced in the summing element 8, for example, are not blocked by a register that is connected downstream in the signal flow path. A switching power loss P is produced on account of the glitches or the processes of switching back and forth which propagate via the line 11 to the summing element 12 connected downstream.

If, in the case of the digital circuit shown in FIG. 2, an additional register for blocking the propagation of glitches is simply inserted into the line 11, as shown in FIG. 3, the functionality of the digital circuit is changed in an undesirable manner. In the changed digital circuit illustrated in FIG. 3, identical components are represented by the same reference symbols as in FIG. 2. An additional register 19 is inserted into the connecting line between the adders 8, 12, and is clocked via a clock line 20. This simple insertion results in an undesired change in the functionality of the feedback digital circuit, as is shown in FIG. 3, in comparison with the original digital circuit, as is illustrated in FIG. 2. The table below shows the output data stream of the digital circuit illustrated in FIG. 3 as a function of an input data stream present at the input 1.

TABLE 2

| I | E(i) | $R_0 = R_1(i-1) + a$ | $R_1 = A(i-1) + b$ | $A(i) = E(i) + R_0(i)$ |
|---|------|----------------------|--------------------|------------------------|
| 0 | 0    | 0                    | 0                  | 0                      |
| 1 | 1    | a                    | b                  | 1 + a                  |
| 2 | 2    | a + b                | 1 + a + b          | 2 + a + b              |

On comparing Table 2 with Table 1, it can be seen that, with the same input data sequence 0, 1, 2, the output data sequence at the output of the digital circuit is different. Therefore, the insertion of the register 19 for avoiding glitches has undesirably changed the function of the digital circuit.

The way in which, in the course of carrying out the design method, a feedback synchronous digital circuit having a reduced switching power loss is formed proceeding from the synchronous digital circuit shown in FIG. 2 is shown by way of the following example.

Figure 4A:
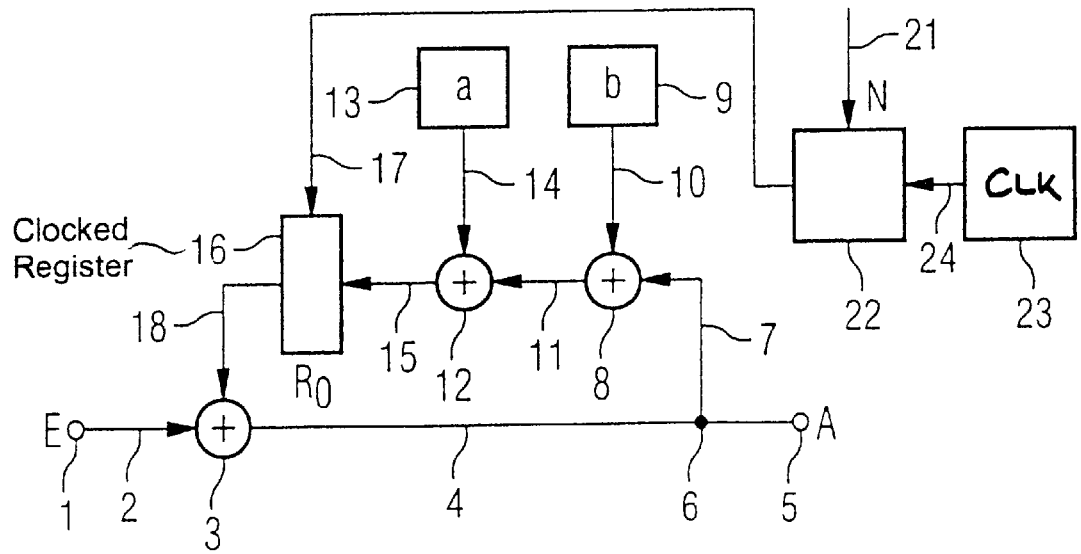
FIGS. 4A, 4B, 4C are schematic block diagrams of an example of the progressive design of a feedback synchronous digital circuit having a reduced switching power loss according to the invention with application of a design method.

FIG. 4A shows the original synchronous digital circuit of FIG. 2, identical reference symbols designating identical components, and also a device 22—controllable via a control line 21—for increasing the frequency of a clock signal received from a clock generator 23 via a line 24. The clock generator 23 has a clock signal CLK at an operating clock frequency f. Depending on the control signal present on the line 21, the operating clock frequency f is output unchanged to the register 16 or is multiplied by a factor N. The factor N can be input.

Figure 4B:
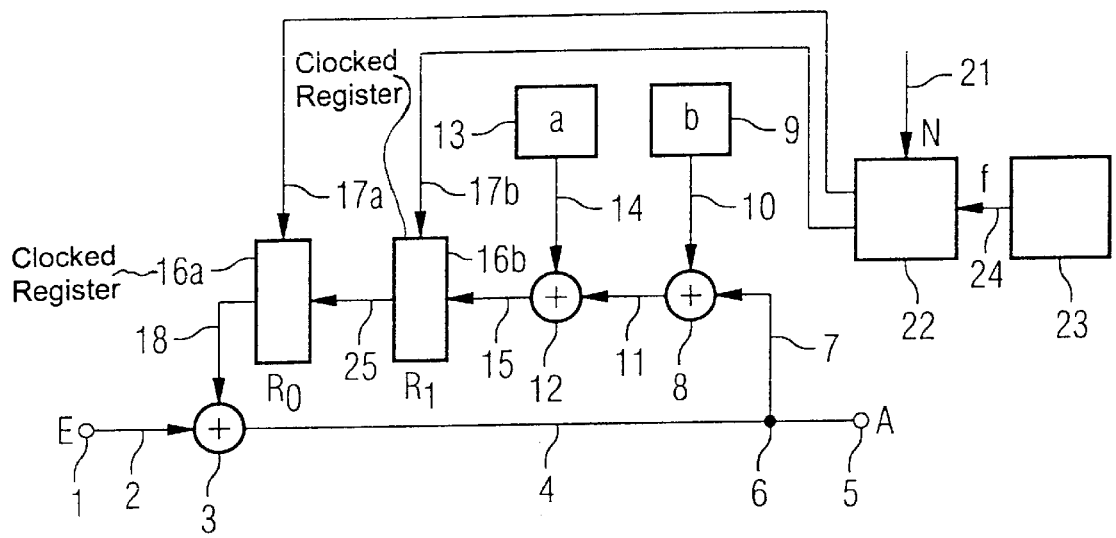

In a first step S1, the register 16 is replaced by N series-connected registers 16a, 16b, which are clocked via clock lines 17a, 17b. See FIG. 4B. The two registers 16a, 16b are connected to one another via a line 25. In the example of FIG. 4B, the original register 16 is displaced by two series-connected registers 16a, 16b. In other words, the factor N is 2.

In a further step S2, the operating clock frequency f is increased by the factor N to an increased clock frequency N·f by the signal generating device 22.

Figure 4C:
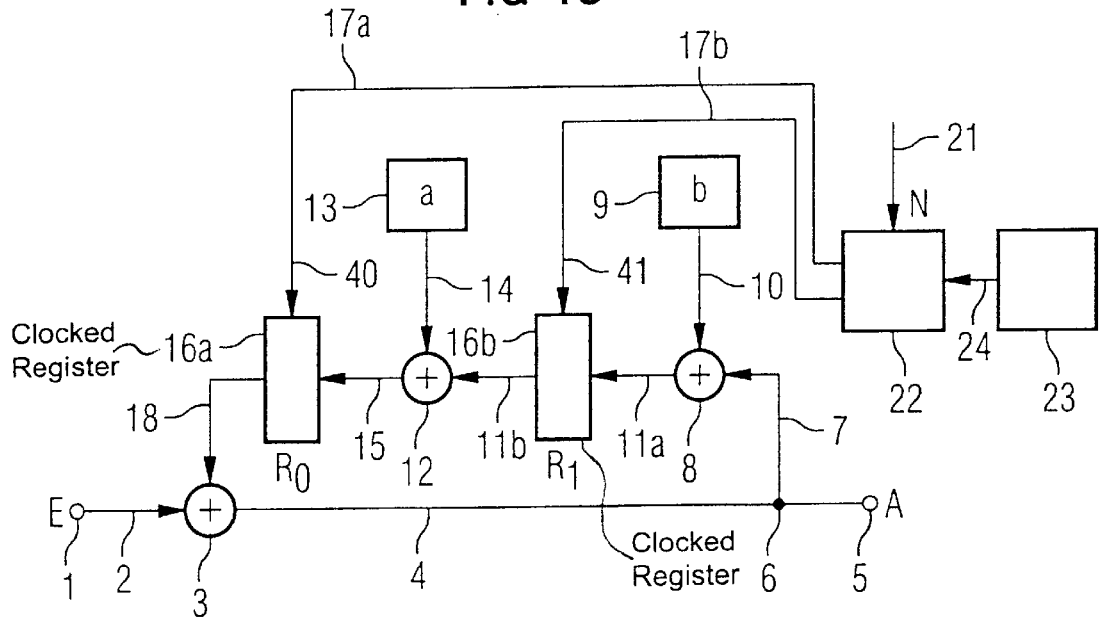

In a third step S3, the additional register 16b produced in the course of the replacement operation is displaced or shifted to the output of the logic circuit 8 connected downstream in such a way that the two registers 16a, 16b are located or connected separate from one another by as many logic circuits 12 as possible. FIG. 4C shows the feedback synchronous digital circuit after the register 16b has been shifted.

At the input 1, each datum of the data input stream E is applied N times in succession and the clock frequency N·f is reduced by the factor N to the original operating clock frequency f by the signal generating device 22, so that the data of the input data stream are applied with the operating clock frequency f. In this case, each of the two registers 16a, 16b is clocked by phase-shifted clock signals via the clock lines 17a, 17b, and the two clock signals present on the lines 17a, 17b are phase-shifted relative to one another. The phase shift is formed by the signal generating device 22. In this case, the phase shift $\phi$ is formed in dependence on the number i of those registers which are located between the associated register and the data input 1.

The phase shift $\phi$ of a register is:

$$\varphi_{N-i-1} = \frac{N - [i \bmod N] - 1}{N} \cdot T$$

where

T=operating clock period of the clock signal;
N=duplicating factor; and
i=number of registers between the register and the data input.

In the example shown in FIG. 4C, the phase shift $\phi_0$ of the register 16a is zero and the phase shift $\phi_1$ of the register 16b is 0.5*T, i.e. half an operating clock period.

The table below shows the values at the data input, at the data output and at the outputs of the registers 16a, 16b for an input data stream 0, 1, 2. The duplicating factor N is two in the table.

TABLE 3

| i | J | E(i) | R0 = R1(j = 1) + a | R1 = A(i − 1) + b | A(i) = E(i) + R0(i) |
|---|---|------|--------------------|-------------------|---------------------|
| 0 | 0 | 0    | 0                  | 0                 | 0                   |
| 0 | 1 | 0    | 0                  | b                 | 0                   |
| 1 | 0 | 1    | a + b              | b                 | 1 + a + b           |
| 1 | 1 | 1    | a + b              | 1 + a + 2b        | 1 + a + b           |
| 2 | 0 | 2    | 1 + 2a + 2b        | 1 + a + 2b        | 3 + 2a + 2b         |
| 2 | 1 | 2    | 1 + 2a + 2b        | 3 + 2a + 3b       | 3 + 2a + 2b         |

Each datum of the data input stream at the input 1 of the digital circuit is applied twice. The register 16a is clocked via the clock line 17a in the clock phase $\phi_0$ and the register 16b is clocked via the clock line 17b in the clock phase $\phi_1$. In the example shown, the two clock signals are phase-shifted by half an operating clock period T.

As can be discerned from a comparison of Table 1 with Table 3, the output data stream at the output 5 of the transformed digital circuit according to the invention—as illustrated in FIG. 4C—is not changed in comparison with the original digital circuit of FIG. 2. In other words, the functionality of the original synchronous feedback digital circuit is preserved upon application of the design method. As a result of the additionally inserted register 16b, however, in comparison with the original digital circuit, the glitches or the undesired processes of switching back and forth manifested in the adder 8 are prevented from propagating on the data signal lines. As a result of the reduction in the number of glitches in the transformed digital circuit in FIG. 4C, the switching power loss of the entire digital circuit is considerably decreased. The data throughput rate of the transformed circuit according to the invention in FIG. 4C is just as high as the original synchronous digital circuit.

The original digital circuit used in the example constitutes a very simple digital circuit. It contains merely adders 3, 8, 12 as logic circuits. I will be understood, however, that the method according to the invention can be applied to synchronous feedback digital circuits containing any desired circuits for implementing logic. The logic circuits may be multipliers, for example. The registers 16a, 16b are preferably flip-flop circuits or latch circuits. The signal generating device 22 for generating the phase shift of the clock signals may likewise be constructed from flip-flops and gates or a PLL (phase locked loop).

The circuit according to the invention can be produced by any desired production technologies for producing digital circuits, in particular using CMOS technology.

I claim:

1. A synchronous feedback digital circuit, comprising:

a data input for receiving an input data stream;

a plurality of logic circuits connected to said data input;

a plurality of clocked registers connected to said logic circuits;

a clock generator for generating an operating clock signal at an operating clock period;

a signal generating device connected to said clock generator and to said clocked registers for generating phase-shifted clock signals for said clocked registers, the phase-shifted clock signals having a phase shift $\phi_i$ for a specific said register $$\varphi_{N-i-1} = \frac{N - [i \bmod N] - 1}{N} \cdot T$$

where T is an operating clock period of the operating clock signal, N is a factor, i is a number of registers between said register clocked by the phase-shifted clock signal and said data input of the digital circuit.

2. The synchronous feedback digital circuit according to claim 1, wherein said registers are flip-flop circuits.

3. The synchronous feedback digital circuit according to claim 1, wherein said registers are latch circuits.

4. The synchronous feedback digital circuit according to claim 1, wherein said signal generating device is a phase shift device comprised of a plurality of flip-flop circuits.

5. The synchronous feedback digital circuit according to claim 1, wherein the digital circuit is produced in CMOS technology.

6. a synchronous feedback digital circuit, comprising:
   a data input for receiving an input data stream;
   a plurality of logic circuits connected to said data input;
   a plurality of clocked registers connected to said logic circuits;
   a clock generator for generating an operating clock signal at an operating clock period;
   a signal generating device connected to said clock generator and to said clocked registers for generating phase-shifted clock signals for said clocked registers, said signal generating device having means for generating the phase-shifted clock signals with a phase shift $\phi_i$ for a specific said register $$\varphi_{N-i-1} = \frac{N - [i \bmod N] - 1}{N} \cdot T$$

where T is an operating clock period of the operating clock signal, N is a factor, i is a number of registers between said register clocked by the phase-shifted clock signal and said data input of the digital circuit.

* * * * *